(12) United States Patent
Koizumi et al.

(10) Patent No.: US 11,264,098 B2
(45) Date of Patent: *Mar. 1, 2022

(54) MEMORY CONTROLLER

(71) Applicant: Kioxia Corporation, Tokyo (JP)

(72) Inventors: Shinya Koizumi, Kamakura Kanagawa (JP); Kiyotaka Iwasaki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/864,378

(22) Filed: May 1, 2020

(65) Prior Publication Data

US 2020/0258576 A1 Aug. 13, 2020

Related U.S. Application Data

(63) Continuation of application No. 15/443,914, filed on Feb. 27, 2017, now Pat. No. 10,685,710.

(Continued)

(51) Int. Cl.
*H03M 13/00* (2006.01)
*G11C 16/08* (2006.01)
*H03M 13/35* (2006.01)
*G06F 11/10* (2006.01)
*G11C 16/04* (2006.01)

(Continued)

(52) U.S. Cl.
CPC .......... *G11C 16/08* (2013.01); *G06F 11/1076* (2013.01); *H03M 13/356* (2013.01); *H03M 13/611* (2013.01); *G11C 11/5621* (2013.01); *G11C 16/0483* (2013.01); *G11C 2029/0411* (2013.01); *H03M 13/1102* (2013.01); *H03M 13/152* (2013.01); *H03M 13/1515* (2013.01)

(58) Field of Classification Search
CPC ............. H03M 13/356; H03M 13/611; H03M 13/1515; H03M 13/1102; H03M 13/152; G11C 16/08; G11C 16/0483; G11C 11/5621; G11C 2029/0411; G06F 11/1076
USPC ........................................................ 714/773
See application file for complete search history.

(56) References Cited

U.S. PATENT DOCUMENTS 7,512,867 B2  3/2009  Ohira et al.
8,375,276 B2 *  2/2013  Geng .................... H04L 1/0057
                                              714/775

(Continued)

FOREIGN PATENT DOCUMENTS

EP    2200029 A1    6/2010
JP    2003-189227 A  7/2003
JP    2012-513627 A  6/2012

*Primary Examiner* — Albert Decady
*Assistant Examiner* — Enam Ahmed
(74) *Attorney, Agent, or Firm* — Allen & Overy LLP (57) ABSTRACT

According to one embodiment, a memory controller includes an encoder, a randomizing circuit, and an interface. The encoder subjects first data received from an external device to error correction coding. The randomizing circuit randomizes second data output from the encoder. The interface transmits third data output from the randomizing circuit to a nonvolatile semiconductor memory and controls write/read of the nonvolatile semiconductor memory. The interface transmits data of a size larger than or equal to a size of a write unit of the nonvolatile semiconductor memory to the nonvolatile semiconductor memory in a write sequence.

20 Claims, 10 Drawing Sheets

Related U.S. Application Data (60) Provisional application No. 62/423,333, filed on Nov. 17, 2016.

(51) Int. Cl.
*G11C 11/56* (2006.01)
*G11C 29/04* (2006.01)
*H03M 13/15* (2006.01)
*H03M 13/11* (2006.01)

(56) References Cited

U.S. PATENT DOCUMENTS

| | | | |
|---|---|---|---|
| 8,482,993 B2 | 7/2013 | Strasser et al. | |
| 8,812,933 B2* | 8/2014 | Joo | H03M 13/1525 |
| | | | 714/763 |
| 8,839,073 B2* | 9/2014 | Cohen | G06F 3/0619 |
| | | | 714/763 |
| 9,432,298 B1 | 8/2016 | Smith | |
| 2003/0113103 A1 | 6/2003 | Kaku | |
| 2004/0227205 A1 | 11/2004 | Walmsley | |
| 2009/0208018 A1* | 8/2009 | Buckingham | G11B 20/0021 |
| | | | 380/277 |
| 2012/0297121 A1 | 11/2012 | Gorobets et al. | |
| 2014/0040704 A1 | 2/2014 | Wu et al. | |
| 2014/0082459 A1* | 3/2014 | Li | G11C 29/52 |
| | | | 714/773 |
| 2014/0101116 A1 | 4/2014 | Alnafoosi et al. | |
| 2014/0189468 A1 | 7/2014 | Radke | |
| 2014/0223228 A1 | 8/2014 | Kim et al. | |
| 2015/0178155 A1 | 6/2015 | Kim et al. | |
| 2016/0062829 A1 | 3/2016 | Harasawa et al. | |
| 2016/0098319 A1 | 4/2016 | Gorobets | |
| 2016/0182086 A1* | 6/2016 | Chen | G11C 29/52 |
| | | | 714/759 |
| 2016/0203873 A1* | 7/2016 | Kuribara | G11C 16/349 |
| | | | 365/185.24 |
| 2018/0074730 A1 | 3/2018 | Inoue et al. | |

* cited by examiner

MEMORY CONTROLLER

CROSS-REFERENCE TO RELATED APPLICATIONS

This application is a continuation of application Ser. No. 15/443,914, filed Feb. 27, 2017 and claims the benefit of U.S. Provisional Application No. 62/423,333, filed Nov. 17, 2016, the entire contents of which are incorporated herein by reference.

FIELD

Embodiments described herein relate generally to a memory controller.

BACKGROUND

Recently, a solid-state drive (SSD) using a nonvolatile semiconductor memory has been put into practical use. Examples of the nonvolatile memory include a flash memory. SSD includes a memory unit and a controller. The memory unit includes, for example, a NAND flash memory cell array, a page buffer, peripheral circuits such as a row decoder and a column decoder, and the like. The controller performs error correction coding (ECC) for input data transmitted from the host device, transmits the coded data to the memory unit, and decodes the data transmitted from the memory unit and transmits the decoded data to the host device. Since a write unit of the NAND flash memory is a page, the controller constitutes data for one page by assembling a plurality of the unit-size input data transmitted from the host device and transmits the data for one page to the memory unit. The controller adjusts the number of input data constituting the data for one page such that the coded data transmitted to the memory unit does not exceed the page size. The size of the coded data written to one page rarely corresponds to the page size of the NAND flash memory.

In addition, in an SSD using a multi-plane flash memory or an SSD using a multi-value flash memory, the controller adjusts the number of the input data used at one-time write such that the size of the data written to the NAND flash memory in the one-time write sequence does not exceed the total page size for write (=page size×number of pages). At this time, too, the size of the data written to the NAND flash memory in one-time write sequence rarely corresponds to the total page size for write.

The coded data transmitted from the controller to the memory unit is thus often smaller than or equal to the size of one page or a plurality of pages for write. Since an initial value of the page buffer of the memory unit is "1" or "0", all "1" or all "0" are written to one page of the memory unit sequentially with the coded data transmitted from the controller if the size of the coded data transmitted from the controller is smaller than one page.

Since adjacent cells store the same "1" or "0" in the region of the memory unit in which all "1" or all "0" are written, the threshold value of the cells is raised based on the data of the adjacent cells by the inter-cell coupling and the threshold distribution is broadened. When the threshold distribution broadens, the memory data of "0" or "1" is read as "1" or "0" and reliability of the memory data is degraded.

BRIEF DESCRIPTION OF THE DRAWINGS

FIG. 10 shows an example of an M-sequence pseudorandom number sequence generator used for randomization.

DETAILED DESCRIPTION

Embodiments will be described hereinafter with reference to the accompanying drawings.

In general, according to one embodiment, a memory controller includes an encoder, a randomizing circuit, and an interface. The encoder subjects first data received from an external device to error correction coding. The randomizing circuit randomizes second data output from the encoder. The interface transmits third data output from the randomizing circuit to a nonvolatile semiconductor memory and controls write/read of the nonvolatile semiconductor memory. The interface transmits data of a size larger than or equal to a size of a write unit of the nonvolatile semiconductor memory to the nonvolatile semiconductor memory in a write sequence.

First Embodiment

Figure 1:
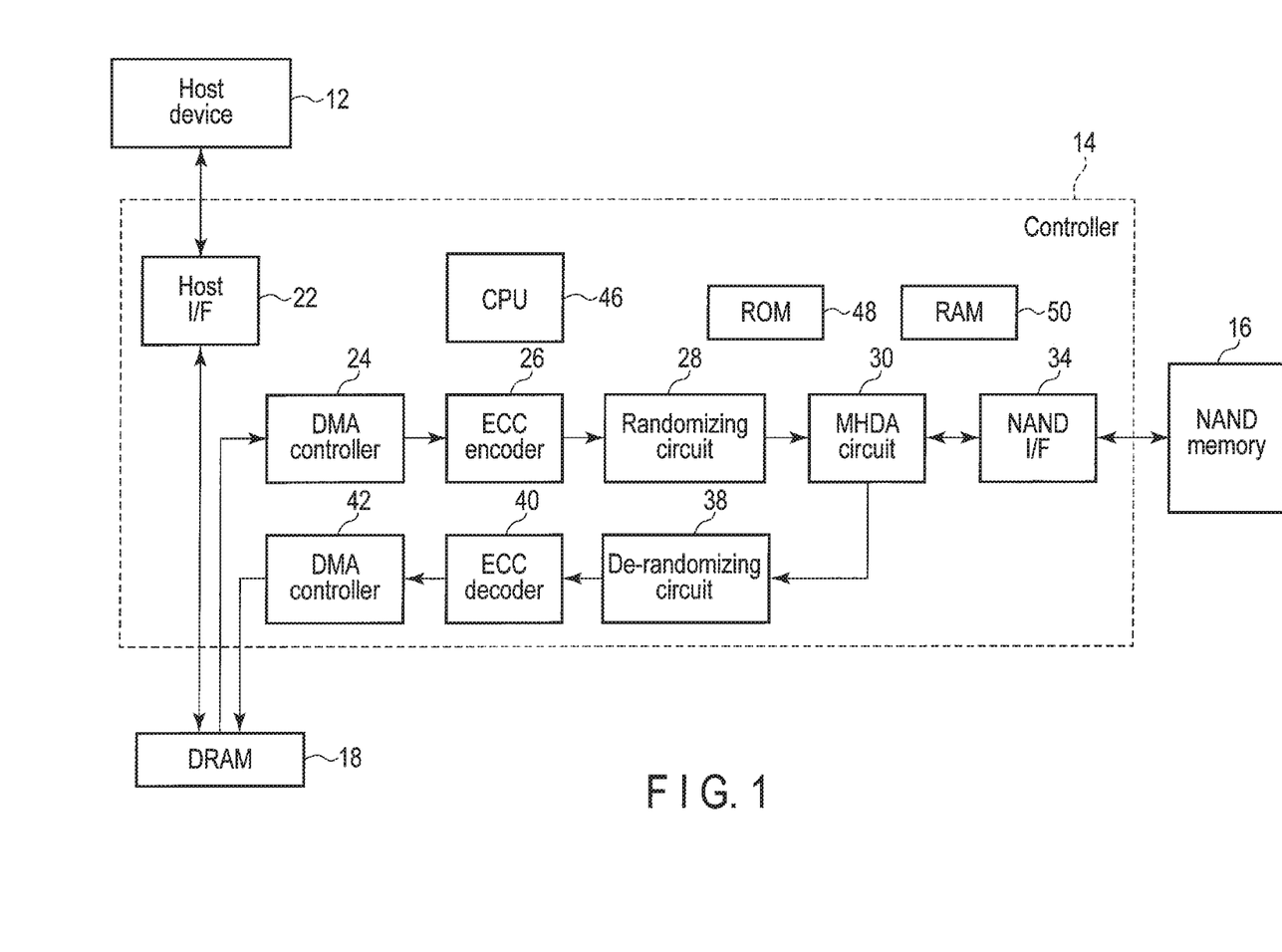
FIG. 1 shows an example of a schematic configuration of a controller of SSD of embodiments.

[Overall Configuration] FIG. 1 shows an example of an overall configuration of SSD. Flash memories include NOR flash memories and NAND flash memories. SSD using a NAND flash memory (hereinafter simply called a flash memory) as an example will be explained here.

A controller 14 is connected to an external device (called a host device) 12. A NAND memory 16 is connected to the controller 14. The host device 12 includes hardware and software to access the NAND memory 16 via the controller 14. The controller 14 includes hardware and software to access the NAND memory 16. The controller 14 manages a physical state (for example, which logical sector address data is included in which physical block address, or which block is in an erased state) inside the NAND memory 16 and controls writing data to and reading data from the NAND memory 16. A volatile memory, for example, a DRAM 18 is connected to the controller 14, and the DRAM 18 temporarily stores unit-size data received from the host device 12 by the controller 14 until the data is written to the NAND memory 16.

The controller 14 includes a host interface 22 including a function of conducting communication with the host device 12. The host device 12 transmits the data which is to be written to the NAND memory 16 to the controller 14. The controller 14 transmits the data read from the NAND memory 16 to the host device 12. The data transmitted from the host device 12 is written to DRAM 18 via the host interface 22.

The size (unit size) of the data transmitted to the controller 14 by the host device 12 is 512 bytes, 520 bytes, 528 bytes, 4 kilobytes, 8 kilobytes, 16 kilobytes, 32 kilobytes, and the like and is often smaller than the page size which is the write unit of the NAND memory 16.

The controller 14 includes a direct memory access (DMA) controller 24 which fetches the data which is to be written to the NAND memory 16 in one-time write sequence, from the DRAM 18. The data fetched from the DRAM 18 by the DMA controller 24 is supplied to an ECC encoder 26. The ECC encoder 26 subjects input data to error-correction coding. More specifically, ECC data is added to the input data to generate coded data. The ECC may be a Reed-Solomon code but the Bose Chaudhum Hocquenghem (BCH) codes, which can relieve random errors more simply, are often used as the ECC since failures discretely occur at random locations in the NAND memory 16. Furthermore, Low Density Parity Check (LDPC) codes having a higher error correcting ability may be used. The size of the ECC data corresponds to the size (unit size) of the data transmitted to the controller 14 by the host device 12, and is, for example, approximately several tens of bytes.

The coded data is supplied to a randomizing circuit 28. The randomizing circuit 28 randomly inverts "0" and "1" of the input coded data. An example of the randomizing circuit 28 will be explained later, but random numbers are generated based on seed values generated by a CPU 46, the random numbers and the input coded data are added, and the input coded data is randomized in the circuit. The probability that all the elements of the data written to the NAND memory 16 are "0" or "1" is thereby reduced and the degradation of reliability of the memory data which results from inter-cell coupling can be prevented.

The output of the randomizing circuit 28 is supplied to a memory hole defect avoiding circuit (hereinafter called MHDA circuit) 30. The MHDA circuit 30 includes a function of receiving acquired location information of a defective memory cell and preventing the defective memory cell from being used for storage of the valid data. The output of the MHDA circuit 30 is transmitted to the NAND memory 16 via a NAND interface 34.

The controller 14 includes a CPU 46 which controls the above-explained elements, a ROM 48 which stores the program executed by the CPU 46, and a RAM 50 serving as a working memory. When the CPU 46 receives a write command, a read command, an erase command and the like from the host device 12, the CPU 46 executes predetermined processing for the NAND memory 16. The host interface 22 is connected to the host device 12 via an I/O line (not shown) which allows plural bits (for example, eight bits) to be transmitted and received in parallel. The NAND interface 34 is also connected to the NAND memory 16 via an I/O line (not shown) which allows plural bits (for example, eight bits) to be transmitted and received in parallel.

When the controller 14 writes data to the NAND memory 16, the controller 14 sequentially inputs a data input command (for example, 80H), a column address, a page address, data, a program command (for example, 10H) and the like to the NAND memory 16 via the NAND interface 34. "H" of command 80H represents a hexadecimal number and, actually, an eight-bit signal "10000000" is given to an eight-bit I/O line in parallel. In other words, a plural-bit command is given to the NAND interface 34 in parallel. In addition, the command and data for the NAND memory 16 are transmitted by using the same I/O line, in the NAND interface 34.

The data read from the NAND memory 16 is supplied to the MHDA circuit 30 via the NAND interface 34. The MHDA circuit 30 includes a function of specifying data read from a defective memory cell based on position information of the defective memory cell which is acquired in advance and not outputting the data. An output of the MHDA circuit 30 is supplied to a de-randomizing circuit 38. The de-randomizing circuit 38 executes inversion processing opposite to the inversion processing executed by the randomizing circuit 28 and outputs the same data as the data input to the randomizing circuit 28. An output of the de-randomizing circuit 38 is supplied to an ECC decoder 40. The ECC decoder 40 executes decoding processing opposite to the coding processing executed in the ECC encoder 26 and outputs the same data as the data input to the ECC encoder 26. An output of the ECC decoder 40 is written to the DRAM 18 by the DMA controller 42. The data read from the DRAM 42 at any time is transmitted to the host device 12 via the host interface 22.

[NAND Memory]

Figure 2:
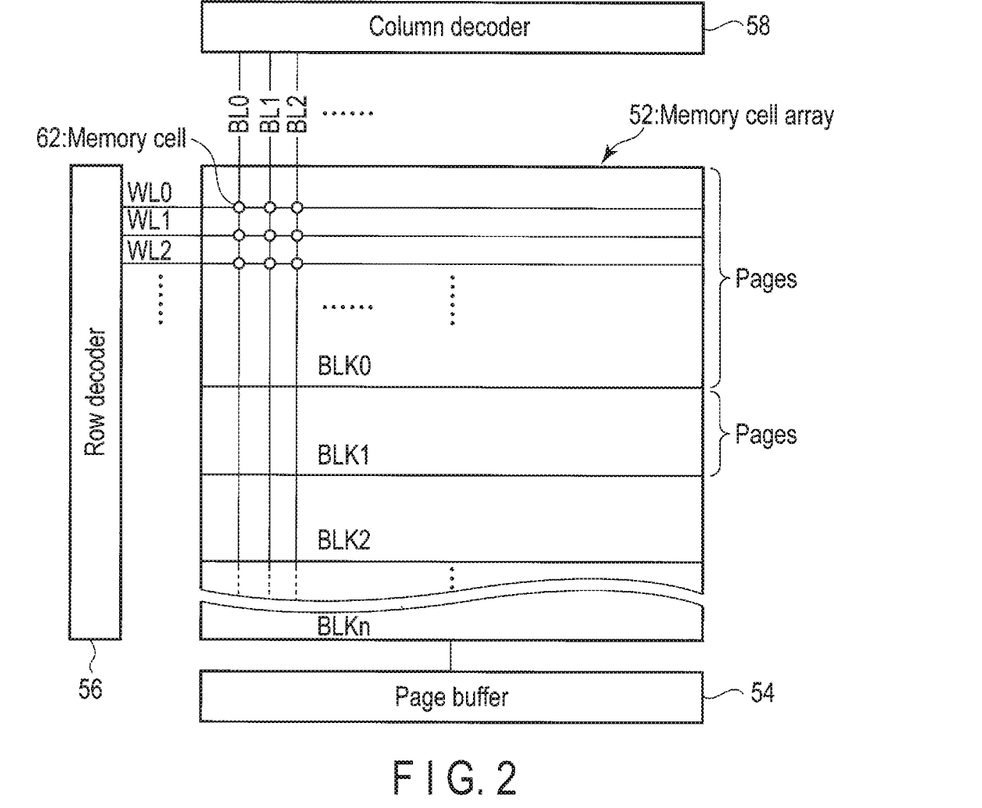
FIG. 2 shows an example of a schematic configuration of a NAND memory.

FIG. 2 shows an example of an inner configuration of the NAND memory 16. The NAND memory 16 includes a flash memory cell array 52, a page buffer 54, a row decoder 56, a column decoder 58 and the like. The memory cell array 52 includes memory blocks BLK0, BLK1, . . . BLKn. n is a positive integer greater than or equal to 2. The memory blocks BLK0, BLK1, . . . are hereinafter simply called memory blocks BLK if not specifically distinguished from each other. The data is erased in units of the memory block. In other words, the data in the same memory block BLK is entirely erased. The memory blocks BLK include memory cell transistors (hereinafter simply called memory cells MC). Word lines WL0, WL1, . . . and bit lines BL0, BL1, . . . orthogonal to the word lines WL0, WL1, . . . are provided in the memory blocks BLK. The word lines WL0, WL1, . . . are hereinafter simply called word lines WL if not specifically distinguished from each other, and the bit lines BL0, BL1, . . . are hereinafter simply called bit lines BL if not specifically distinguished from each other. The memory cell transistors in the same row are connected to the same word line WL. In addition, the memory cell transistors in the same column are connected to the same bit line BL in units of memory cells. Data write and data read are executed for every assembly of memory cells connected to one word line WL, and the assembly of the memory cell transistors is called "one page". For example, 16K, 32K, or 64K memory cell transistors are connected to one word line WL to constitute one page. Any one of the word lines WL is selected by the row address and any one of the bit lines BL is selected by the column address at the read time and the write time. For example, the memory blocks BLK include 128 pages.

The page buffer 54 temporarily stores the data transmitted from the controller 14 and temporarily stores the data read from the memory cell array 52. The size of the data which can be stored in the page buffer 54 is the size which is a sum of the write unit of the memory blocks BLK, i.e., the page size and some margin. In a flash memory of a multi-plane structure, the size of the page buffer 54 is the size corresponding to pages which are to be written simultaneously. The margin is the size larger than or equal to the maximum size of the region which may not be used by the MHDA circuit 30. At writing data to the NAND memory 16, the page buffer 54 executes data input and output processing for the NAND memory 16 in unit of one page corresponding to the own storage capacity. At reading data from the NAND memory 16, the memory cell data for one page is transferred to the page buffer 54 and is read serially from the page buffer 54 via the I/O line. The row decoder 56 selects any one of the word lines WL at writing the data and at reading the data. The column decoder 54 selects any one of the bit lines BL at writing the data and at reading the data.

Figure 3:
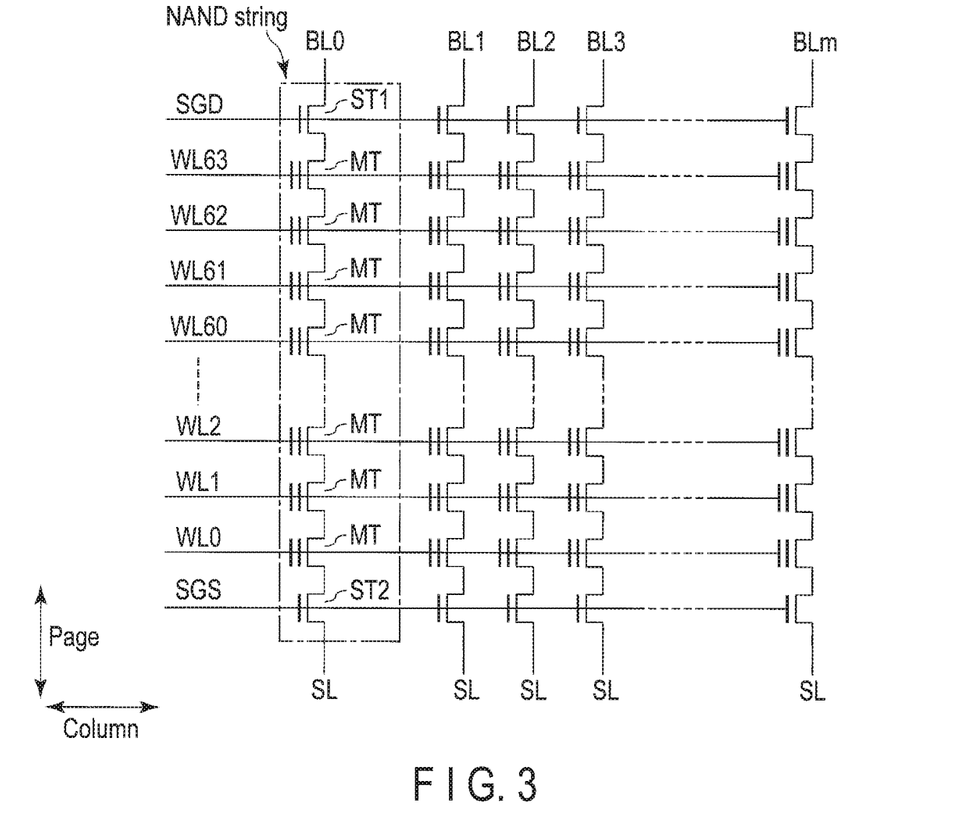
FIG. 3 shows an example of a schematic configuration of a memory block.

FIG. 3 is an equivalent circuit diagram showing an example of the memory block BLK. The memory block BLK includes (m+1) NAND strings arranged in the word line WL direction. m is a positive integer greater than or equal to 2. The NAND string includes a plurality of, for example, 64 memory cell transistors MT and select transistors ST1 and ST2 connected to both ends of the memory cell transistors. The number of the memory cell transistors MT is a mere example and may be 8, 16, 32, 128 or the like. A drain of the select transistor ST1 is connected to any one of the bit lines BL0 to BLm. A source of the select transistor ST2 is connected to the source line SL. A gate of the select transistor ST1 of one page is connected to a select gate line SGD. A gate of the select transistor ST2 of one page is connected to a select gate line SGS.

The memory cell transistor MT is a MOS transistor including a laminated gate formed on the semiconductor substrate by intervening a gate insulating film, though not shown in the figure. The laminated gate includes a charge storage layer (floating gate) formed on the gate insulating film and a control gate formed by intervening an inter-gate insulating film on the charge storage layer. In the NAND string, sixty-four memory cell transistors MT are arranged between a source of the select transistor ST1 and a drain of the select transistor ST2 such that current paths of the respective memory cell transistors are connected in series. The control gates in the memory cell transistors MT arranged on a side closer to the source of the select transistor ST2 are sequentially connected to the word lines WL0 to WL63. Therefore, the drain of the memory cell transistor MT connected to the word line WL63 is connected to the source of the select transistor ST1 and the source of the memory cell transistor MT connected to the word line WL0 is connected to the drain of the select transistor ST2.

The word lines WL0 to WL63 are commonly connected to the control gates of the memory cell transistors MT in (m+1) NAND strings inside the memory blocks BLK. In other words, the control gates of the memory cell transistors MT in the same row are connected to the same word line WL inside the memory blocks BLK. The bit lines BL0 to BLm are connected to the respective drains of the select transistors ST1 in (m+1) NAND strings inside the memory blocks BLK. In other words, the NAND string in the same column is connected to the same bit line BL inside the memory blocks BLK.

The memory cells MC may be capable of storing two-level data "0" and "1", i.e., 1-bit data or four-level data "00," "01," "10" and "11," i.e., 2-bit data. In the latter multi-level cells, a lower page and an upper page are included at the same address.

Figure 4:
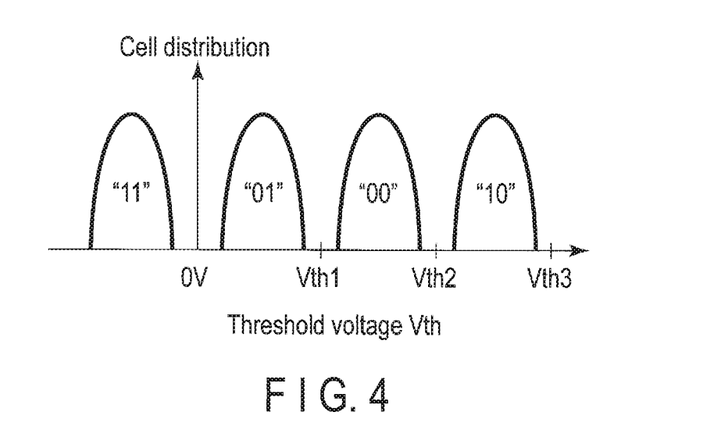
FIG. 4 shows an example of a threshold distribution of a memory cell.

A threshold value of the multi-level memory cell MC will be explained with reference to FIG. 4. FIG. 4 is a graph showing an example of a threshold distribution of the memory cells MC, and a lateral axis indicates a threshold value Vth and a longitudinal value indicates the number of memory cells. The multi-level memory cells can store 2-bit data in one cell.

The memory cells MC can store four data "11," "01," "00" and "10" in order of lower threshold voltages Vth. The threshold value Vth of the memory cell storing data "11" is lower than OV. The threshold value Vth of the memory cell storing data "01" is higher than OV and lower than Vth1. The threshold value Vth of the memory cell storing data "00" is higher than Vth1 and lower than Vth2. The threshold value Vth of the memory cell storing data "10" is higher than Vth2 and lower than Vth3.

[Page Data Structure]

Figure 5:
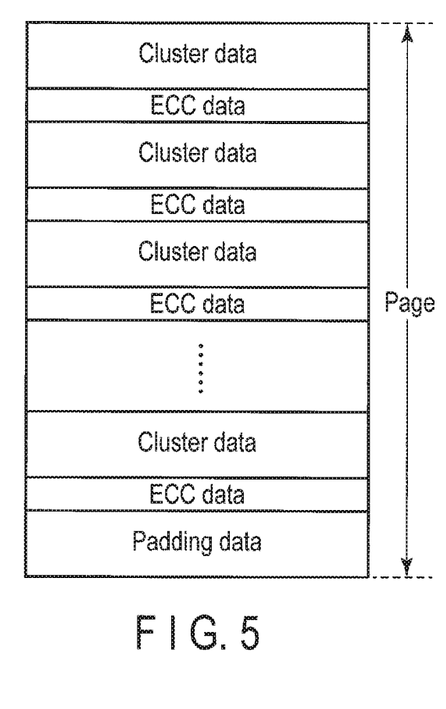
FIG. 5 shows a configuration example of data input to the NAND memory when MHDA is invalidated.

FIG. 5 shows an example of the page data transmitted from the controller 14 to the page buffer 54 of the NAND memory 16 when the MHDA function of the MHDA circuit 30 is invalidated (i.e., a defective memory cell is also used). The data in the unit size of 512B, 520B, 528B, 4K, 8K, 16K, 32K and the like (hereinafter often called cluster data) is transmitted from the host device 12. The cluster data is written to the DRAM 18. The page data includes a plurality of cluster data, a plurality of error-correcting code (ECC) data corresponding to the cluster data, and one padding data. Since the page size, the unit size and the size of the ECC data are already known, the controller 14 can determine, in advance, the number of cluster data constituting one page data.

The DMA controller 24 fetches from the DRAM 18 the elements of cluster data which constitute one page data and supplies the cluster data to the ECC encoder 26.

The ECC encoder 26 subjects one of the cluster data to ECC processing, adds the ECC data to the original data (cluster data) and outputs the data. The size of the ECC data is varied in accordance with the correction ability. The ECC encoder 26 repeats the ECC processing in accordance with the number of cluster data fetched by the DMA controller 24.

The number of cluster data constituting one page data is set such that the total size of the cluster data and the ECC data is smaller than or equal to one page size since the total size of the cluster data and the ECC data is not permitted to exceed one page size. For this reason, the total size of the cluster data and the ECC data is often smaller than one page size. However, if the size of the data from the controller 14 to the NAND memory 16 is smaller than one page size, the reliability on data is lower as mentioned in background. In the embodiment, the controller 14 controls to make the padding data follow the total size of the cluster data and the ECC data and to make the data of one page size to be consequently transmitted from the controller 14 to the NAND memory 16 as shown in FIG. 5. The controller 14 can acquire, in advance, the size of the padding data from the page size, the unit size, the size of the ECC data, and the number of cluster data constituting one page data.

The padding data transmitted from the controller 14 to the NAND memory 16 is the data other than all "0" or all "1". The controller 14 generates the padding data at any one of the portions and adds the padding data to a sum of a pair of the cluster data and the ECC data. For example, the DMA controller 24 may add the padding data at reading one page of the last cluster data from the DRAM 18, the ECC encoder 26 may add the padding data before or after the ECC processing, or the randomizing circuit 28 may add the data before or after the randomization. The padding data added before the ECC processing of the ECC encoder 26 does not need to be subjected to the ECC processing. The padding data added after the randomization of the randomizing circuit 28 is the data other than all "0" or all "1." For example, random data may be used such that "0"s or "1"s is not sequential, or not the random data but data in which "0" and "1" are alternately arranged or several "0"s and "1"s are alternately arranged may be used. Since the padding data added at the other portions is randomized by the randomizing circuit 28, the data quality is not limited but any data (for example, all "0" or all "1") can be used.

Figure 6:
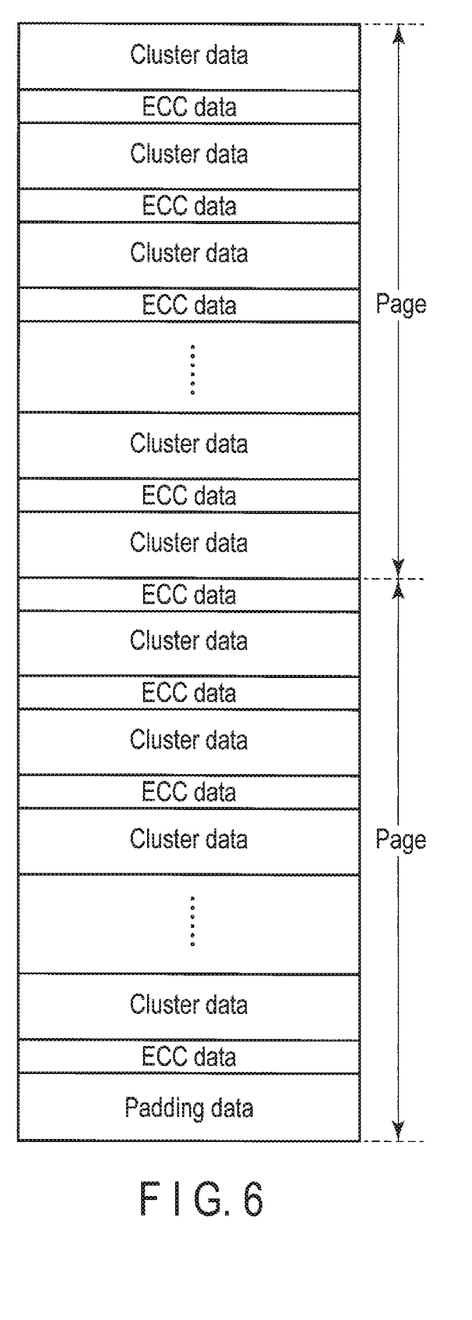
FIG. 6 shows another configuration example of the data input to the NAND memory when MHDA is invalidated.

In the flash memory of the multi-plane structure, too, the size of the padding data can also be calculated in advance. FIG. 6 shows an example of the page data of two pages transmitted from the controller 14 to the page buffer 54 of the NAND memory 16 when a multi-page (for example, two-page) program is executed in the flash memory of the multi-plane (for example, two-plane) structure. In FIG. 6, too, the MHDA function of the MHDA circuit 30 is also invalidated. When the two-page program is executed, the size of the data which can be stored in the page buffer 54 is the page size for two pages.

When the cluster data included in the two-page data are written to the DRAM 18, the DMA controller 24 fetches the cluster data from the DRAM 18 and supplies the cluster data to the ECC encoder 26. The ECC encoder 26 repeats the ECC processing in accordance with the number of cluster data fetched by the DMA controller 24. The controller 14 makes the padding data follow the sum of the pairs of the cluster data and the ECC data as shown in FIG. 6. The data of just two-page size is transmitted from the controller 14 to the NAND memory 16. The cluster data is ended (or the ECC data is started) at the break of page in FIG. 6 for convenience of explanations, but the cluster data or the ECC data may be recorded across pages.

Similarly to the single-page program, the controller 14 can require, in advance, the size of the padding data from the page size, the unit size, the size of the ECC data, and the number of cluster data included in two-page data. The padding data may be added at any one of the portions in the controller 14.

Figure 7:
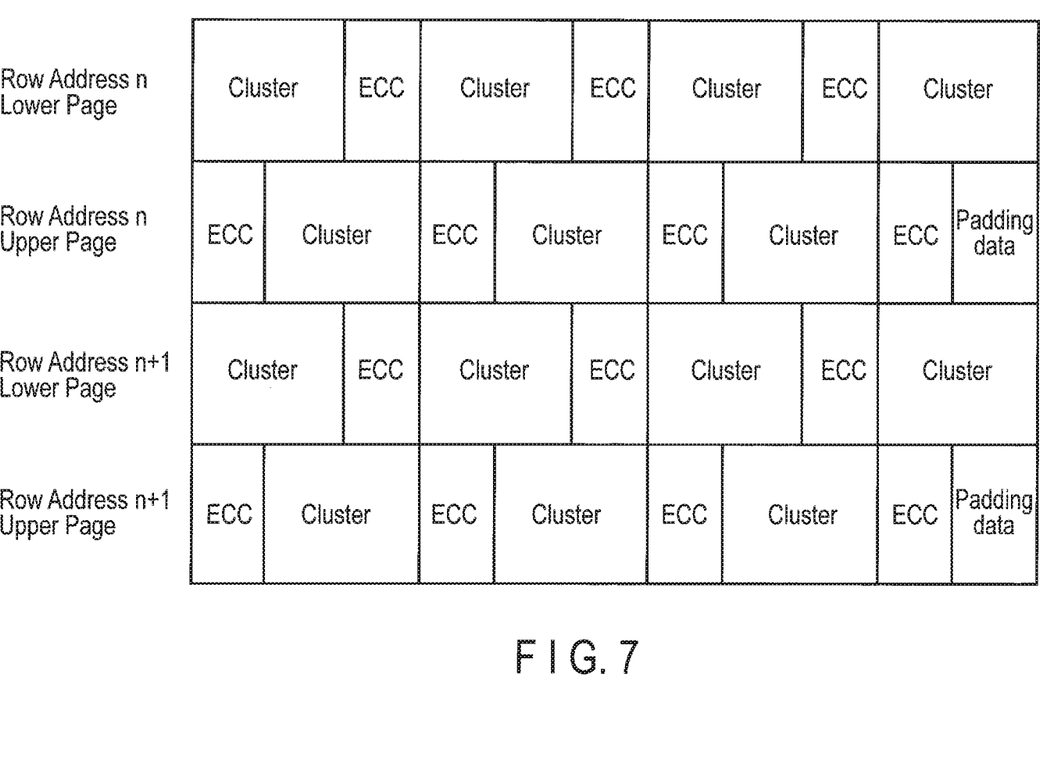
FIG. 7 shows an example of arrangement of the data of the NAND memory when the data of FIG. 6 is written.

FIG. 7 shows an example of arrangement in the memory, of the data which is written to the NAND memory 16 after the two-page program shown in FIG. 6 is executed when the memory cell of the NAND memory 16 is the multi-level memory cell. Since the padding data is not all "0" or all "1", the threshold value of the cluster data of adjacent pages at the same column address is not raised by inter-cell coupling and the cluster data is not lost.

Figure 8:
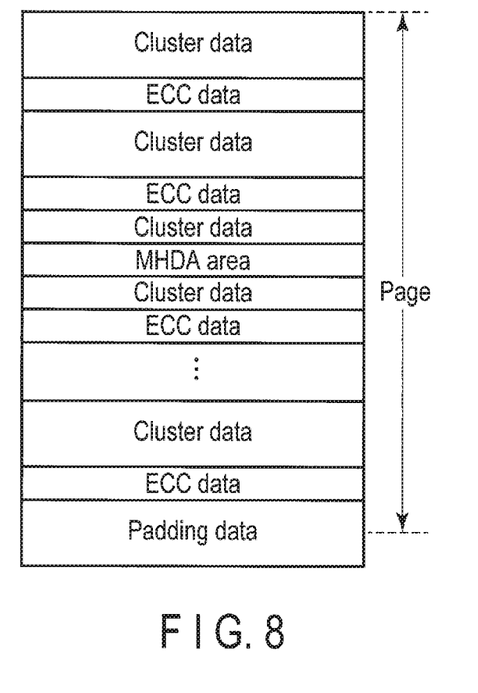
FIG. 8 shows a configuration example of data input to the NAND memory when MHDA is validated.

FIG. 8 shows an example of the page data transmitted from the controller 14 to the page buffer 54 of the NAND memory 16 when the MHDA function of the MHDA circuit 30 is validated (i.e., a defective memory cell is not used for storage of the valid data). When the controller 16 receives position information of the defective memory cell, the controller 16 can recognize which cluster data to be written to the page corresponds to the defective memory cell. It is assumed here that the defective memory cell is in the region of the memory to which the third cluster data is to be written. The MHDA circuit 30 arranges the data indicating the MHDA area instead of the cluster data, at the portion to be written to the defective memory cell, of the third cluster data. The size of the data transmitted to the NAND 16 exceeds the page size by arranging the MHDA area data. The page buffer 54 can store the data larger than the page size by considering this, and stores all elements of the data shown in FIG. 8.

The NAND memory 16 is controlled such that data other than the data indicating the MHDA area is written to the memory cell array 52, the column address output from the column decoder 58 is skipped for the data indicating the MHDA area, and no data is written to the defective memory cell, when the data shown in FIG. 8, of the page buffer 54, is written to the memory cell array 52.

The other manner of preventing the defective cell from being used for storage of the valid data is to arrange invalid data instead of the MHDA area data. Since intended data cannot be written to the defective cell, "0" data or "1" data may be written to the defective memory cell as the invalid data instead of skipping write of the defective memory cell. In this case, the padding data exceeding the page shown in FIG. 8 is not written to the memory cell array 52.

Since defective memory cells are different in size in NAND pages, the controller 14 inserts the MHDA area data to avoid the defective memory cell, based on the position information of the defective memory cell of the corresponding page while transmitting the data to the NAND memory 16.

[Randomization]

Figure 9:
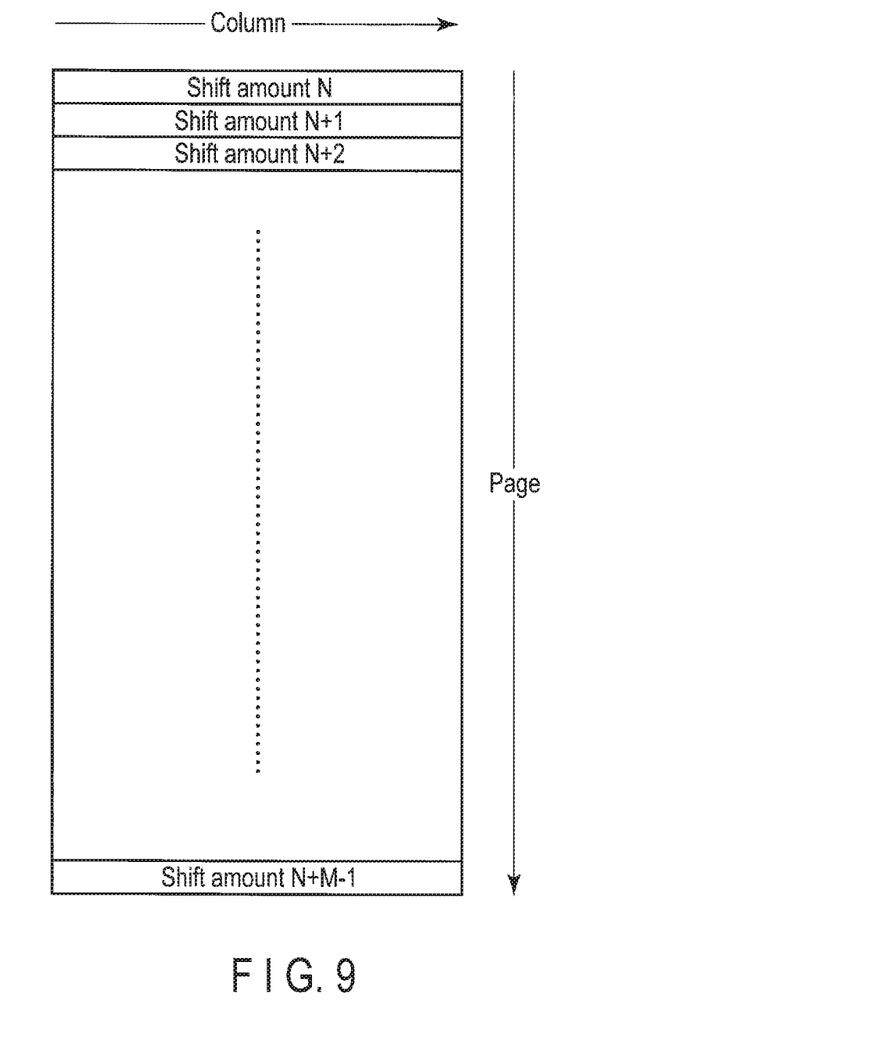
FIG. 9 shows an example of a basic concept of randomization.

Randomization will be explained. FIG. 9 shows a basic principle of randomization. The randomizing circuit 28 executes data randomization in at least one of the column direction and the page direction. As shown in FIG. 3, the column direction is the direction of arrangement of the word lines and the page direction is the direction of arrangement of the bit lines and the NAND strings. The randomizing circuit 28 outputs a value obtained by adding a random number to the original data string as randomized data. For example, the ECC data is used as a basic unit and M-sequence random number in which the same random number sequence does not appear again in the ECC data is selected as the random number. In addition, the M-sequence random number is selected as the random number such that the same random number value does not appear in the same column (1 column=8 bits). For example, if the ECC data is equal to 1 KB, a random number circuit having a cycle of 8 KB or more is used. For example, a 14-bit M-sequence shift register which generates a random number in 16384 cycles is used as a random number circuit.

As shown in FIG. 9, the randomization in the column direction is implemented by scrambling based on the M-sequence random number. The randomization in the page direction is implemented by the M-sequence random number shift based on the random number value of a leading page. Alternately, the randomization in the page direction may be implemented by control of inversion based on the word line address. The shift amount is determined at the logical page address in the block, in the randomization in the page direction. Since the physical page address and the logical page address may be different from each other, it is desirable to recognize a reference shift amount of the block leading page in advance.

Figure 10:
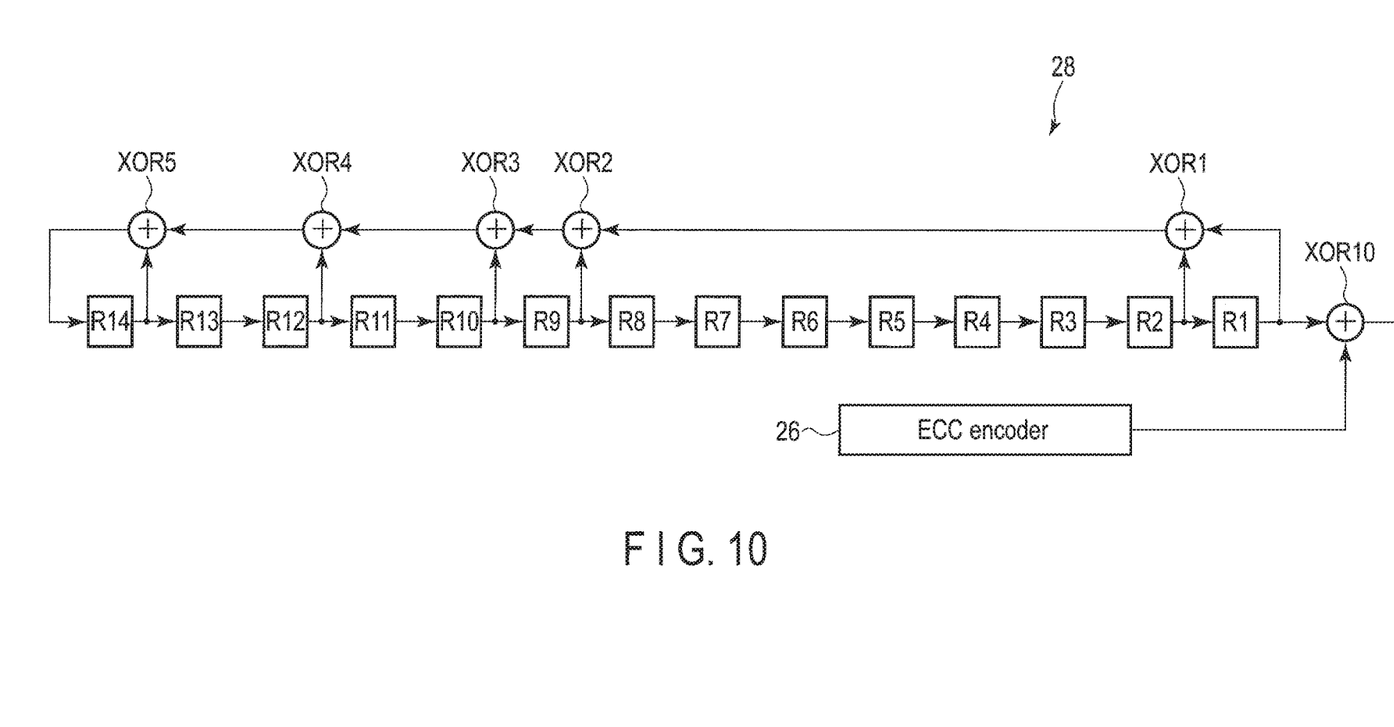

An example of a Fibonacci type M-sequence pseudo-random number sequence generation circuit to implement the above-explained randomization will be explained with reference to FIG. 10. The pseudo-random number sequence generation circuit generates the random data in 1 k column data cycle, and exclusive OR is taken with the random data and the data to be written to the NAND memory 16 (i.e., output data of the ECC encoder 26). More specifically, the pseudo-random number sequence generation circuit includes registers R1 to R14 connected in series and operated as shift registers, and exclusive OR gates XOR1 to XOR5, as shown in FIG. 10. An output of the top register R1 and the output data of the ECC encoder 26 are input to an exclusive OR XOR10. Initial values (also called seed values) of the registers R1 to R14 are different in each bit line. The cycle generally adopts a number greater than the ECC data processing unit (for example, 1024 bytes or more). The seed values of the pseudo-random number sequence generation circuit are supplied in each bit line. The seed values are prepared in advance as parameters and are loaded on the pseudo-random number sequence generation circuit at the time of, for example, starting direct memory access (DMA) transfer or switching the offset.

An output terminal of the register R1 and an output terminal of the register R2 are connected to the exclusive OR XOR1. An output terminal of the exclusive OR XOR1 and an output terminal of the register R9 are connected to the exclusive OR XOR2. An output terminal of the exclusive OR XOR2 and an output terminal of the register R10 are connected to the exclusive OR XOR3. An output terminal of the exclusive OR XOR3 and an output terminal of the register R12 are connected to the exclusive OR XOR4. An output terminal of the exclusive OR XOR4 and an output terminal of the register R14 are connected to the exclusive OR XOR5. Sequence of "0" or "1" in the cluster data transmitted to the NAND memory 16 is thereby prevented.

[Write Sequence]

Figure 11:
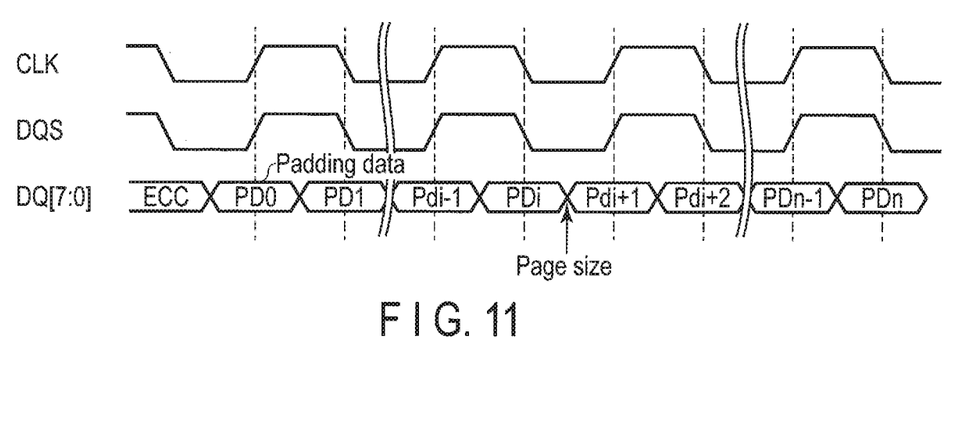
FIG. 11 is an example of a sequence diagram for writing data of FIG. 10 to the NAND memory.

FIG. 11 shows an example of states of a clock CLK, data strobe DQS and data DQ (8 bits) in the sequence in which the controller 14 writes the data to the NAND memory 16 when the MHDA function of the MHDA circuit 30 is validated (i.e., a defective memory cell is not used). The clock CLK, data strobe DQS and data DQ (8 bits) are transmitted from the NAND interface 34 to the NAND memory 16. Since the size of the data transmitted from the controller 14 to the NAND memory 16 by the MHDA function exceeds the page size of the NAND memory 16 as shown in FIG. 8, the NAND interface 34 continues transmitting the clock CLK, data strobe DQS and data DQ to the NAND memory 16 although the data size exceeds the page size. All the elements of the data shown in FIG. 8 are thereby stored in the page buffer 54. However, only i elements of padding data PD0 to PDi, of n elements of padding data PD0 to PDn, are in the page size. For this reason, the i+1-th and following elements of padding data PDi+1 to PDn are written to the page buffer 54, but are not written to the memory cell array 52. The i+1-th and following elements of padding data PDi+1 to PDn are thus kept in the page buffer 54.

Conclusion of First Embodiment

Thus, according to the first embodiment, the cluster data of a certain size is supplied from the host device to the controller and subjected to ECC processing. The data to be written to one page is formed of a plurality of elements of cluster data and the ECC data. If the data is smaller than the page size, the padding data of random data for short page size in which "0" and "1" are not sequential or data in which "0" and "1" are alternately arranged or several elements of "0" and "1" are alternately arranged is arranged to follow the data. For this reason, since an amount of data (i.e., randomized data) equivalent to the page size is written to the page buffer 54 of the NAND memory 16, the degradation of reliability of the memory data which results from inter-cell coupling caused by sequence of "1" or "0" in the memory cell array can be prevented.

Second Embodiment

Figure 12:
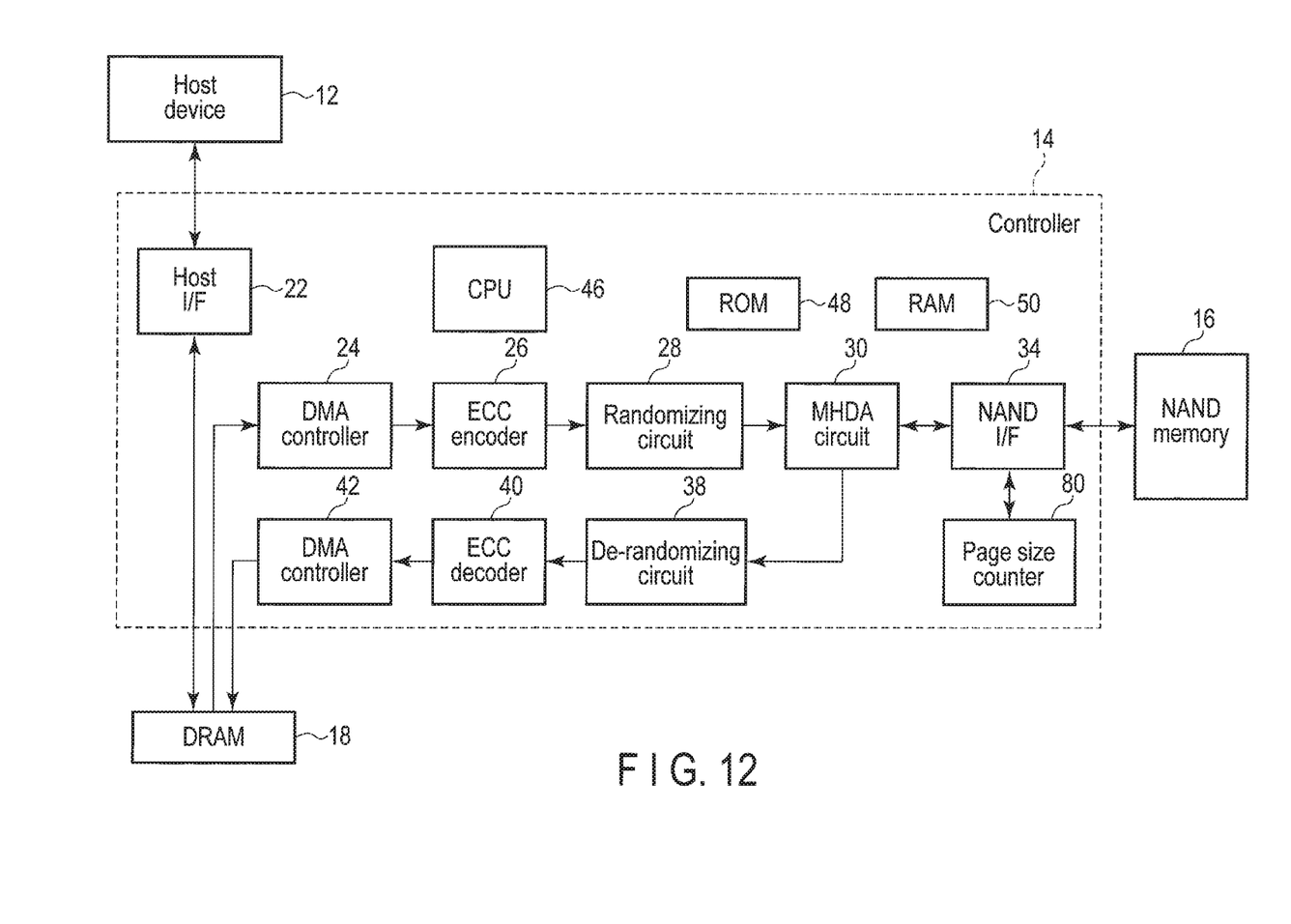
FIG. 12 shows an example of a schematic configuration of a controller of SSD of a second embodiment.

FIG. 12 shows an example of an overall configuration of SSD of a second embodiment concerning modification of the controller 14. The controller 14 includes a page size counter 80 in addition to the configuration of the first embodiment. The page size counter 80 counts a size of data written from the controller 14 to the page buffer 54 of the NAND memory 16 and, transmits a notification to the NAND interface 34 when the data of the page size of the NAND memory 16 is written to the page buffer 54. The NAND interface 34 stops writing the data to the page buffer 54 when the NAND interface 34 receives the notification from the page size counter 80.

Figure 13:
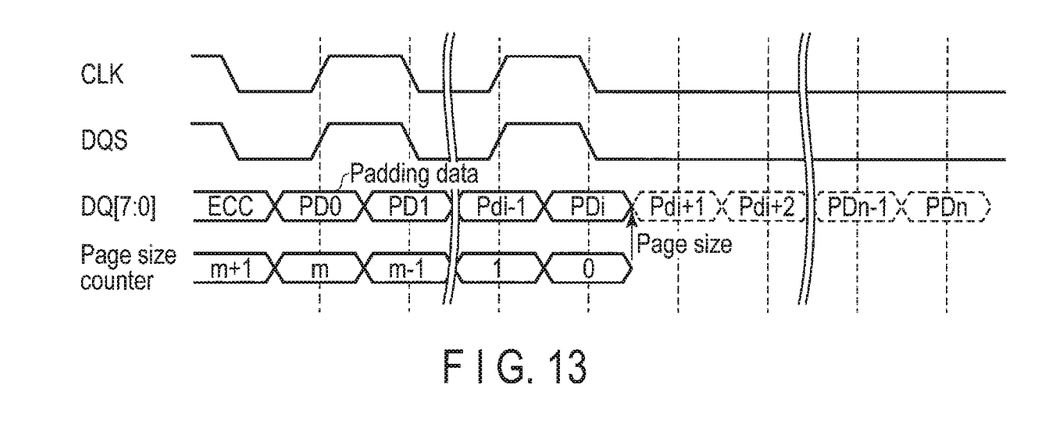
FIG. 13 is an example of a write sequence diagram of the second embodiment.

FIG. 13 shows an example of states of a clock CLK, data strobe DQS, data DQ (8 bits) and the page size counter 80 in which the controller 14 writes the data to the NAND memory 16 when the MHDA function of the MHDA circuit 30 is validated (i.e., a defective memory cell is not used). The size of the data transmitted from the controller 14 to the NAND memory 16 exceeds the page size of the NAND memory 16 due to the padding data as shown in FIG. 8. The whole data including the exceeding data is written in the page buffer 54 but the exceeding data is not written to the flash memory cell array 52 in the first embodiment, but the exceeding data is not written to the page buffer 54 in the second embodiment. For this reason, the time and power consumption for writing the exceeding data to the page buffer 54 can be saved. The page size is set in the page size counter 80 as an initial value. The page size is set in the page size counter 80 as an initial value and is decremented by one every time data of a certain bit (for example, 8 bits) is transferred from the controller 14 to the page buffer 54.

When the data of the page size is transferred from the controller 14 to the page buffer 54, the counter value of the page size counter 80 becomes zero. After this, the NAND interface 34 stops the transmission of the clock CLK and the data strobe DQS and also stops the transmission of the padding data DQ. The data of one page size is thereby transferred from the controller 14 to the page buffer 54.

According to the second embodiment, when the page buffer 54 of the NAND memory 16 becomes full of the data, the NAND interface 34 stops the transmission of the clock CLK and the data strobe DQS and also stops the transmission of the padding data DQ. Thus, when the page buffer 54 becomes full of the data, the write sequence can be stopped, next processing can be started rapidly, and the power consumption can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions. The various modules of the systems described herein can be implemented as software applications, hardware and/or software modules, or components on one or more computers, such as servers. While the various modules are illustrated separately, they may share some or all of the same underlying logic or code. The accompanying claims and their equivalents are intended to cover such forms or modifications as would fall within the scope and spirit of the inventions.

What is claimed is:

1. A memory system comprising:
a nonvolatile memory; and
a controller configured to:
 receive first data from a host,
 encode the first data to generate an error correction code;

generate second data that includes the first data and the error correction code;
randomize the second data to generate third data;
generate fourth data;
randomize the fourth data to generate fifth data, the size of the fifth data being smaller than the size of the first data;
generate sixth data that includes the third data and the fifth data; the size of the sixth data being equal to the size of a unit of a write operation to the nonvolatile memory; and
transmit the sixth data to the nonvolatile memory.

2. The memory system of claim 1, wherein
the controller includes a randomizer configured to randomize at least one of the second data and the fourth data.

3. The memory system of claim 2, wherein
the randomizer is configured to:
receive input data;
generate a pseudo random number sequence; and
generate output data by performing an exclusive- or operation on the input data and the pseudo random number sequence.

4. The memory system of claim 1, wherein
the first data is received from the host by a plurality of transfers.

5. The memory system of claim 1, wherein
the fourth data has not been received from the host.

6. The memory system of claim 1, wherein
all bits of the fourth data are same value.

7. The memory system of claim 1, wherein
the fifth data includes both "1" data and "0" data.

8. The memory system of claim 1, wherein
the nonvolatile memory includes a plurality of blocks, each of the plurality of blocks includes a plurality of pages, and
the size of the unit of the write operation is equal to the size of each of the plurality of pages.

9. The memory system of claim 1, wherein
the nonvolatile memory includes a plurality of planes, each of the plurality of planes includes a plurality of blocks, each of the plurality of blocks includes a plurality of pages, and
the size of the unit of the write operation is the size of each of the plurality of pages multiplied by the number of planes.

10. The memory system of claim 1, wherein
the nonvolatile memory is a NAND flash memory.

11. A method of controlling a nonvolatile memory, comprising:
receiving first data from a host,
encoding the first data to generate an error correction code;
generating second data that includes the first data and the error correction code;
randomizing the second data to generate third data;
generating fourth data;
randomizing the fourth data to generate fifth data, the size of the fifth data being smaller than the size of the first data;
generating sixth data that includes the third data and the fifth data, the size of the sixth data being equal to the size of a unit of a write operation to the nonvolatile memory; and
transmitting the sixth data to the nonvolatile memory.

12. The method of claim 11, wherein
the randomizing of at least one of the second data and the fourth data is performed by using a randomizer.

13. The method of claim 12; wherein
the randomizer is configured to:
receive input data;
generate a pseudo random number sequence; and
generate output data by performing an exclusive or operation on the input data and the pseudo random number sequence.

14. The method of claim 11, wherein
the first data is received from the host by a plurality of transfers.

15. The method of claim 11; wherein
the fourth data has not been received from the host.

16. The method of claim 11, wherein
all bits of the fourth data are same value.

17. The method of claim 11, wherein
the fifth data includes both "1" data and "0" data.

18. The method of claim 11, wherein
the nonvolatile memory includes a plurality of blocks each of the plurality of blocks includes a plurality of pages, and
the size of the unit of the write operation is equal to the size of each of the plurality of pages.

19. The method of claim 11, wherein
the nonvolatile memory includes a plurality of planes, each of the plurality of planes includes a plurality of blocks, each of the plurality of blocks includes a plurality of pages, and
the size of the unit of the write operation is equal to the size of each of the plurality of pages multiplied by the number of planes.

20. The method of claim 11, wherein
the nonvolatile memory is a NAND flash memory.

* * * * *